United States Patent [19]

Flatley et al.

[11] 4,349,584

[45] Sep. 14, 1982

[54] PROCESS FOR TAPERING OPENINGS IN TERNARY GLASS COATINGS

[75] Inventors: Doris W. Flatley, Belle Mead; Sheng T. Hsu, Lawrenceville, both of N.J.

[73] Assignee: RCA Corporation, New York, N.Y.

[21] Appl. No.: 258,431

[22] Filed: Apr. 28, 1981

[51] Int. Cl.³ .......................................... H01L 21/316
[52] U.S. Cl. .......................................... 427/85; 357/54; 427/89; 427/95; 427/93; 156/653; 430/314
[58] Field of Search .................. 427/93, 95, 89, 85; 156/653; 430/314

[56] References Cited

U.S. PATENT DOCUMENTS

| 3,481,781 | 12/1969 | Kern | 427/95 |
|---|---|---|---|
| 3,833,919 | 9/1974 | Naber | 357/71 |
| 3,925,572 | 12/1975 | Naber | 427/87 |
| 4,091,407 | 5/1978 | Williams et al. | 357/54 |
| 4,097,889 | 6/1978 | Kern et al. | 357/54 |
| 4,273,805 | 6/1981 | Dawson et al. | 427/93 |

OTHER PUBLICATIONS

Y. Tanagaki et al., J. Electrochem. Soc.: vol. 125, No. 3 (1978) "A New Self-Aligned Contact Technology" pp. 471-472.

W. Kern et al., J. Electrochem. Soc.: vol. 117, No. 4 (1970) "Chemical Vapor Deposition . . . Silicon Devices" pp. 562-573.

Primary Examiner—John D. Smith
Attorney, Agent, or Firm—Birgit E. Morris; Donald S. Cohen; Lawrence P. Benjamin

[57] ABSTRACT

A process for defining improved tapered openings in glass coatings requires that passivating layers be formed of a doped silicon oxide having a relatively low flow temperature formed on a layer of undoped silicon oxide. After the contact openings are formed, both oxide layers are heated to a temperature below the flow temperature of the doped layer for a period of time sufficient to only soften and partially reflow the doped layer, the temperature being insufficient to form a significant oxide growth on the exposed portion of the semiconductor body.

8 Claims, No Drawings

PROCESS FOR TAPERING OPENINGS IN TERNARY GLASS COATINGS

BACKGROUND OF THE INVENTION

This invention relates, in general, to semiconductor devices and, more particularly, to a novel process for forming contoured openings in insulating layers of semiconductor devices.

It has long been known that there exists a need, in the manufacture of semiconductor devices, to round the corners of lower layers of a multi-layer structure so that when subsequent layers are deposited, the surface presented to the subsequent layer will not have sharp or abrupt steps for the subsequent layers to traverse. Deposition of the subsequent layers, without the prior removal of the undesirable contours, may result in discontinuities in the metal interconnect line, thus producing an inoperative device and lowering the overall yield. Further, since some lower or subsequent layers are conductive, that is, metallic or doped polycrystalline silicon (polysilicon) lines, these lines must be insulated from each other.

The deposition of glass insulating films that can be flowed at temperatures of, for example 1200°–1300° C. to produce a gradual taper over steep steps can usually alleviate this situation. In U.S. Pat. No. 3,833,919 which issued to C. T. Naber on Sept. 3, 1974, there is described a multi-level conductor structure using a lower, undoped silicon oxide insluating layer and a second layer of phosphorous doped oxide formed thereover. The doped oxide layer, when heated to about 1000° C., will flow over the steps in the undoped oxide layer. However, there are difficulties associated with this procedure. For example, after contact openings are formed, the maintenance of exposed areas of silicon at elevated temperatures, for extended periods of time, will cause the formation of an undesirable oxide on the exposed silicon. Additionally, the exposed silicon is susceptible of being doped, by diffusion, from the doped oxide layer while the elevated temperature will drive the dopant from the heavily doped layer into the undoped layer. To prevent doping of the undoped layer, a layer of silicon nitride must be interposed between the two oxide layers. Then, in order to remove any oxide that may have been formed on the exposed silicon areas, an additional processing step will have to be introduced to etch the undesirable oxide which in turn will etch desirable oxide.

Accordingly, the deposition of a glass film that can be made to produce a gradual taper over steep steps in the substrate will alleviate this undesirable situation. Phosphosilicate glass (PSG) with about 6–8 wt % P has been used for this purpose since such glasses have been found to have good dielectric and sodium gettering properties and, additionally, can be readily formed, using chemical vapor deposition techniques, from the hydrides. However, such glasses are undesirable in that the fusion or flow temperatures are in the range of about 1000°–1100° C. which have been found to be too high to produce satisfactory radiation-hardened complementary MOS integrated circuits and other heat sensitive large scale integrated circuits. Increasing the phosphorous content of PSG, while lowering the flow temperature, nevertheless increases the chances of corrosion during operation of the device.

In U.S. Pat. No. 3,481,781, which issued to W. Kern on Dec. 2, 1969 and is assigned to the same assignee as the subject application and in an article "Chemical Vapor Deposition of Silicate Glasses for Use with Silicon Devices" by W. Kern et al., *J. Electrochem. Soc.:* ELECTROMECHANICAL TECHNOLOGY 117, Apr. 1970 (I Deposition Techniques, pp. 562–568) and (II Film Properties, pp. 568–573) there are the initial discussions of the use and method of forming borophosphosilicate ternary glasses (BPSG). These BPSG layers are especially attractive to the semiconductor art as it has been found that they are more compatible with positive photoresist in that a positive photoresist will adhere better to BPSG than negative photoresist. In either event, adhesion to BPSG layers is much better than to the prior art 6 wt % PSG. It has also been found that with BPSG, the constituents thereof may be tailored so that it flows at about 900°–950° C. and will initially soften at a temperature of about 750° C.

SUMMARY OF THE INVENTION

In accordance with the present invention, a ternary glass layer of boron and phosphorous (BPSG) is utilized as a passivating coating on the surface of an undoped silicon oxide layer on a semiconductor body. This ternary glass layer is characterized by having a flow temperature of about 900°–950° C. and having a softening temperature of about 700°–750° C. After depositing and flowing the BPSG layer, a contact hole is opened in the glass layer to expose the underlying silicon oxide layer. The structure is then heated only to the softening temperature of the BPSG which is significantly below the flow temperature, in order to recontour and round any sharp corners that may have been created when the contact opening was made.

DETAILED DESCRIPTION OF THE INVENTION

While the following exegesis will be presented in terms of describing a bulk silicon device, we do not wish to be so limited. Those skilled in the art will readily recognize that the silicon body may be formed on an insulative substrate or carrier and, as such, our invention applies equally to devices commonly referred to as silicon-on-sapphire. The expression silicon-on-sapphire (SOS) is also meant to include the use of spinel or monocrystalline beryllium oxide as well.

In carrying out the basic form of our invention one should, preferably, have completed the formation of the particular device desired, at least to the point where one is preparing to deposit the metallic interconnects or pad connections. In this event, the device is then provided with an appropriate passivating layer which may be BPSG formed in accordance with the process set forth in U.S. Letters Pat. No. 3,481,781. For this invention a BPSG passivating layer having about 3-3½ wt % P and about 2-2½ wt % B (hereinafter referred to as type A) is deposited to a thickness of about 6,000–8,000 angstroms. It should be understood that this particular BPSG formulation is suggested by way of example only, since various other combinations of boron and phosphorous may be utilized to provide a passivating layer having the appropriate characteristics. For example, another BPSG passivating layer that has been found to work satisfactorily is one containing 4–5 wt % P and 3–4 wt % B (hereinafter referred to as type B). We have found that if type A BPSG is heated to about 900° C. in steam, for a period of about 30 minutes, this coating will flow over any steps and provide a gently undulating surface similar to that previously provided by the heavily doped phosphorous oxide in U.S. Pat. Nos. 3,833,919. As further distinguished from the doped layer described in the 3,833,919 patent which requires heating to a temperature of over 1000° C., the type A BPSG passivating layer, when heated in $N_2$, $H_2$, Ar, He, for example, for a period of 30 minutes, will flow at a temperature of about 950° C. The type B BPSG will first flow at a temperature of about 800° C. when heated in a steam ambient and about 850° C. in a nitrogen, helium, argon or other similar inert atmosphere.

After the passivating layer is made to flow, to provide the tapered or gently undulating surface, a layer of photoresist is applied, exposed and subsequently hardened to provide a pattern thereon which pattern defines the contact openings to be subsequently etched. The next step requires the etching of the BPSG to form contact openings which, may be accomplished by either plasma etching or wet chemical etching, which will produce an essentially steep wall in the passivating layer. This passivating layer may be etched using a buffered HF solution which will only etch the doped BPSG and will have no effect on the underlying silicon layer. Thereafter, the etching is terminated by removal from the etching solution and by gently washing. It is at this point that at least one advantage of using the BPSG described becomes evident in that with the improved adhesion of the photoresist material to the BPSG there is less ballooning or raising up of the photoresist and, thus, more accurate etching is performed.

The layer of photoresist is removed and the structure heated to the softening point of the BPSG. In the case of the type A BPSG it has been found that the BPSG layer will soften significantly when heated to a temperature of about 750° for a period of 20–30 minutes in steam, or heated to about 800° for a period of 20–30 minutes in an inert atmosphere such as $N_2$, $H_2$, or Ar. The type B BPSG has been known to soften at a temperature of about 700° in steam and about 750° in an inert atmosphere. In both cases it would only be necessary to heat for a period of about 20–30 minutes.

By heating the device to a temperature of about 750° (type A BPSG) we have maintained the exposed silicon region at a temperature and ambient that is well below the point at which any significant oxide will form thereon, as such low temperatures are not conducive to the formation of an oxide. In any event, should an oxide form thereon, it will be so thin that any subsequent deposition of a metallic interconnect thereon will readily punch through and provide good contact to the surface of the silicon. Further, by maintaining such low temperatures for such short periods of time there is almost no doping of the underlying undoped oxide layer. Hence, no intervening nitride layer is necessary, thereby eliminating the steps of masking and nitride deposition.

Thus, by utilizing the particular BPSG (type A or type B) and by following the procedures herein outlined wherein low temperatures are used to soften and recontour the sharp edges of a contact opening, we have provided an improved method of fabricating semiconductor devices which provides high yield and better contacts.

What is claimed is:

1. A process for forming a tapered opening in a glass passivating coating on the surface of a semiconductor body comprising the steps of:

forming a layer of dense, undoped silicon oxide on the semiconductor body;

forming a layer of ternary doped silicon oxide on the undoped layer, the doped layer characterized by having a given flow temperature;

forming a contact opening in both silicon oxide layers to expose a portion of the semiconductor body; and heating both oxide layers to a temperature below the given flow temperature of the doped layer for a period of time sufficient to only soften and partially reflow the doped layer at the edges of the contact opening yet insufficient to form a significant oxide growth on the exposed portion of the semiconductor body.

2. The process of claim 1, wherein:

the layer of ternary doped silicon oxide is formed of a borophosphosilicate glass having a flow temperature, in steam, below about 800°–950° C. and a softening temperature, in steam, below about 700°–850° C.

3. The process of claim 2, wherein:

the doped silicon oxide is a borophosphosilicate glass having about 3-3½ wt % P and about 2-2½ wt % B.

4. The process of claim 3, wherein:

the layer of dense, undoped silicon oxide is formed by the thermal oxidation of the semiconductor body.

5. The process of claim 4, wherein the step of heating both oxide layers comprises:

maintaining both oxide layers at a temperature of about 700° C. for a period of about 20–30 minutes, in steam.

6. The process of claim 2, wherein:

the doped silicon oxide is a borophosphosilicate glass having about 4–5 wt % P and 3–4 wt % B.

7. The process of claim 6, wherein:

the layer of dense, undoped silicon oxide is formed by the thermal oxidation of the semiconductor body.

8. The process of claim 7, wherein the step of heating both oxide layers comprises:

maintaining both oxide layers at a temperature of about 850° C. for a period of about 20–30 minutes, in steam.

* * * * *